United States Patent
Albrecht

(10) Patent No.: US 10,254,359 B2
(45) Date of Patent: Apr. 9, 2019

(54) POWER AMPLIFIER DEVICE FOR A MAGNETIC RESONANCE DEVICE AND MAGNETIC RESONANCE DEVICE

(71) Applicant: Adam Albrecht, Nürnberg (DE)

(72) Inventor: Adam Albrecht, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1130 days.

(21) Appl. No.: 14/574,275

(22) Filed: Dec. 17, 2014

(65) Prior Publication Data
US 2015/0168514 A1 Jun. 18, 2015

(30) Foreign Application Priority Data
Dec. 17, 2013 (DE) .......................... 10 2013 226 273

(51) Int. Cl.
*G01R 33/36* (2006.01)
*H03F 3/21* (2006.01)
(Continued)

(52) U.S. Cl.
CPC .......... *G01R 33/3614* (2013.01); *H01L 23/36* (2013.01); *H03F 3/195* (2013.01); *H03F 3/211* (2013.01); *H01L 23/4006* (2013.01); *H01L 23/473* (2013.01); *H01L 25/072* (2013.01); *H01L 2924/0002* (2013.01); *H01L 2924/19051* (2013.01); *H03F 2200/09* (2013.01); *H03F 2200/447* (2013.01)

(58) Field of Classification Search
CPC ..... G01R 33/3614; H03F 3/211; H03F 3/195; H01L 23/36
See application file for complete search history.

(56) References Cited

U.S. PATENT DOCUMENTS 6,867,492 B2 * 3/2005 Auburger ............ H01L 23/3677
257/675
7,705,676 B2 * 4/2010 Kirchmeier ....... H01J 37/32009
330/251
(Continued)

FOREIGN PATENT DOCUMENTS

DE 102010032077 A1 1/2012
DE 102010032078 A1 1/2012
(Continued)

OTHER PUBLICATIONS

German Office Action for German Application No. 10 2013 226 273.6, dated Aug. 12, 2014 with English Translation.

*Primary Examiner* — Dixomara Vargas
(74) *Attorney, Agent, or Firm* — Lempia Summerfield Katz LLC

(57) ABSTRACT

A power amplifier device for a magnetic resonance device includes a circuit board with at least one power amplifier module, and at least one electronics structure including coupled conductor paths arranged on opposing sides of the circuit board. The power amplifier device also includes a cooling plate operable for cooling components on the circuit board that heat up during operation and abutting the circuit board on one side. The cooling plate has a depression that follows the course of the conductor path and faces the conductor path in the region of the conductor path of the electronics structure that is arranged on the side of the circuit board facing the cooling plate.

20 Claims, 1 Drawing Sheet

(51) Int. Cl.
*H03F 3/195* (2006.01)
*H01L 23/36* (2006.01)
 H01L 23/473 (2006.01)
 H01L 25/07 (2006.01)
 H01L 23/40 (2006.01)

(56) References Cited

U.S. PATENT DOCUMENTS

| | | | |
|---|---|---|---|
| 8,729,471 B2 * | 5/2014 | Barbi | G01T 1/2018 |
| | | | 250/306 |
| 9,151,814 B2 * | 10/2015 | Albrecht | H05K 7/20927 |
| 2012/0187951 A1 | 7/2012 | Albrecht et al. | |
| 2012/0188717 A1 | 7/2012 | Albrecht et al. | |
| 2013/0076359 A1 | 3/2013 | Albrecht | |
| 2013/0147486 A1 | 6/2013 | Albrecht | |

FOREIGN PATENT DOCUMENTS

| | | |
|---|---|---|
| DE | 102011006061 | 9/2012 |
| DE | 102011088028 | 3/2013 |

\* cited by examiner

POWER AMPLIFIER DEVICE FOR A MAGNETIC RESONANCE DEVICE AND MAGNETIC RESONANCE DEVICE

This application claims the benefit of DE 10 2013 226 273.6, filed on Dec. 17, 2013, which is hereby incorporated by reference in its entirety.

BACKGROUND

The present embodiments relate to a power amplifier device for a magnetic resonance device.

Power amplifier devices are already in use in magnetic resonance devices of the prior art, since as part of the imaging process, nuclear spins, oriented via a transmit antenna, of an examination object are to be excited. High levels of power are used to operate this transmit antenna. The high levels of power are provided by a power amplifier device that may be incorporated into a transmit unit of the magnetic resonance device.

Known power amplifier devices frequently work with at least one power amplifier module, which has at least one power electronics component. As many components and/or conductive patterns as possible may be implemented on a common circuit board. Power amplifier devices that have several amplifier modules (e.g., four amplifier modules) each generating an output power of 5 to 8 kW, so that in combination a power of, for example, 30 kW may be achieved, are known. The power amplifier modules, which represent an output stage, may therefore also be referred to as output stage modules. Push-pull output stages that work on the push-pull principle with symmetrical input signals may be used. Because of the high level of power to be generated with the power amplifier device, the transistors used in the power amplifier modules as power electronics components are cooled. It is known to arrange a cooling plate (e.g., made of copper) underneath the circuit board (e.g., a printed circuit board (PCB)), through which cooling plate coolant channels, draining positions to be cooled, are routed.

In this connection, electronics structures (e.g., conductive patterns) that fulfill their function thanks to the interaction between conductor paths that are arranged on opposing sides of the circuit board may also be used. In the example of the amplifier modules, which work in push-pull mode (e.g., as a push-pull output stage), in each case a phase of a symmetrical input signal is assigned to a same number of transistors. This provides that a first group of transistors (e.g., including just one transistor) receives a 0° signal, while the other group of transistors (e.g., including just one transistor) receives a reversed-phase 180° signal. The drain outputs of the transistor components are combined in a first conductor path, which is in inductive exchange with the second conductor path, so that thanks to inductive coupling, the amplified output signal may be generated. An example of such electronics structures based on inductive (e.g., based on a magnetic field) coupling is a balun, where such electronics structures may also be used for generating the input signals for the transistor components.

Examples of such known power amplifier units may be found in DE 10 2011 006 061 A1 or DE 10 2011 088 028 A1.

A particular problem is the implementation of the electronics structures, in which conductor paths arranged on two opposing sides of the circuit board are to interact with one another. Whereas such electronics structures may be implemented externally to the circuit board using coaxial cable or the like, significant cable lengths, for which there is not enough space, may be used. For the correct, desired coupling of the conductor paths, a free space filled with air or a material with a dielectric constant close to that of air is to be provided. This is not possible if the metal of a cooling plate directly abuts a side of the circuit board. Hence, in the prior art, extremely complex implementations, which, for example, work using ferrites or divided cooling plates that are mechanically difficult to manipulate, may be pursued. For example, the free space provided for the inductive or magnetic interaction between the conductor paths is enclosed by grounded conductive material. For this reason, for a suboptimal, complex and difficult manufacturing process, circuit boards may be bonded to the cooling plates.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the implementation of electronics structures including inductively interacting conductor paths in power amplifier devices with a circuit board and a cooling plate is simplified.

A method includes arranging a cooling plate in a region of a conductor path of an electronics structure on a side of a circuit board facing the cooling plate. The cooling plate has a depression that follows the course of the conductor path and faces the conductor path.

The cooling plate not bonded to the circuit board is matched to the electronic embodiment of the circuit board, so that a particularly high degree of mechanical integration is enabled due to cavities on the cooling plate that correspond to the conductor paths. The cavities, which are provided for inductively coupled resonators, baluns and/or other electronics structures with inductively coupled conductor paths, therefore form a part of the cooling plate (e.g., as a depression in the cooling plate following the course of the conductor path, facing the cooling plate, of the electronics structure). The electrical part of the electronics structure is arranged on the circuit board, so that there is a match between the circuit board and the cooling plate. For example, the circuit board is thus cheap to manufacture, since there is no longer any need for an expensive, copper-bonded circuit board. The cooling plate and the circuit board may thus be implemented as components that are separate but nevertheless match one another, so that the cooling plate is attached to the circuit board by at least one attachment device (e.g., by screwing).

With the cooling plate matched to the electronics of the circuit board, there is thus no need for the complex solutions used until now in the prior art (e.g., the use of ferrites or copper-bonded circuit boards).

An embodiment provides that the cooling plate is connected at least partially along the edge of the depression in an electrically conductive manner to a grounded, electrically conductive, flat rear-side coating of the circuit board using a connector. Thus, there is therefore a good electrical connection between the frequently present rear-side metallization of the circuit board, which is grounded, and the cooling plate that may be made of metal, which consequently is electrically conductive. Thus, together with the depression (e.g., cavity) in the cooling plate, a free space that is suited for the inductive coupling of the conductor paths and may, for example, be filled with air is formed.

In one or more of the present embodiments, the connector is an elastic electrically conductive material (e.g., a conductive elastomer) that is press-mounted between the cooling plate and the circuit board. Electrically conductive elastomer gaskets, which are already commercially available and may be routed around the depression and are press-mounted for the connection of the circuit board and the cooling plate, may be provided for the connector. The electrically conductive elastomer gaskets form an excellent electrical connection between the back of the circuit board and the electrically conductive cooling plate. For example, silicon materials that have a silver surface may be used to implement such a gasket. Another possibility is to use indium foil. Such materials are, for example, also known as "conductive elastomer gaskets".

The electronics structures themselves may emit heat via the conductor paths, and therefore, losses occur there. This may, for example, happen when high outputs are to be transported via the coupled conductor paths. In one or more of the present embodiments, in the case of an electronics structure emitting heat during operation, the depression is filled at least partially (e.g., completely) by a heat-conducting material. For example, a solid, heat-conducting elastomer such as heat-conducting pastes may be used. The material is to have a low dielectric constant, which is close to the dielectric constant of air (e.g., <5 or <3). The properties of the depression needed for the coupling are not changed in practice (e.g., where the material is not conductive), but an excellent heat dissipation from the electronics structure into the cooling plate is enabled.

Different types of electronics structures with two inductively coupled conductor paths may be provided. Examples of this are a balun and/or a resonator coupled via a magnetic field. Other such electronics structures may also be provided, and may be used in a power amplifier device.

In one embodiment, the cooling plate may be made of aluminum and/or copper. Both materials have excellent heat-conducting properties, and are readily available and may be worked using known methods.

The cooling plate may have a cooling channel in the region at least of one component that heats up. The principal components that heat up during operation are, in a power amplifier device, the transistors of the power amplifier modules. It is, for example, known to provide recesses in the circuit board in order to be able to position the transistors closer to the cooling plate. Cooling channels may be routed through the cooling plate to these transistors or other components that heat up during operation. If the cooling plate is made of aluminum, the cooling plate may have cooling channels made of copper.

Besides the power amplifier device, one or more of the present embodiments also relate to a magnetic resonance device including a power amplifier device. The basic structure of magnetic resonance devices is already known in the prior art and need not be further explained here. The power amplifier device may form part of a transmit unit of the magnetic resonance device. All explanations of the power amplifier device may be transferred analogously to the magnetic resonance device, with which the same advantages may be obtained.

DETAILED DESCRIPTION

Figure 1:
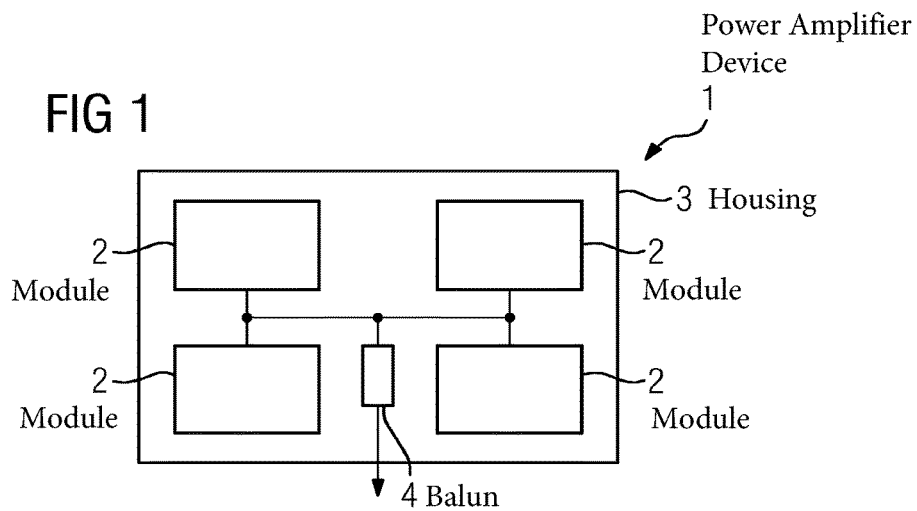
FIG. 1 shows a schematic diagram of one embodiment of a power amplifier device.

FIG. 1 shows a schematic diagram of one embodiment of a power amplifier device 1. The power amplifier device 1 includes, for example, four power amplifier modules 2 that are schematically shown in FIG. 1 as function blocks. Each of the power amplifier modules 2 generates a part of the total output, where all power amplifier modules 2 are arranged in a housing 3. The output signals of the amplifier modules 2 are, for example, combined via a balun 4 as an electronics structure including inductively coupled conductor paths arranged on opposing sides of a circuit board.

There are several possibilities for the embodiment of the amplifier modules 2, which are widely known in the prior art and will not be explained in greater detail here. For example, output stage amplifier modules, in which transistors are used as power electronics components (e.g., 16 transistors), the drain output signals of which are combined by way of the balun 4 to form the total output signal, may be provided. Other embodiments that do not depend on the embodiment and interconnection of the power amplifier modules 2 may also be provided.

Figure 2:
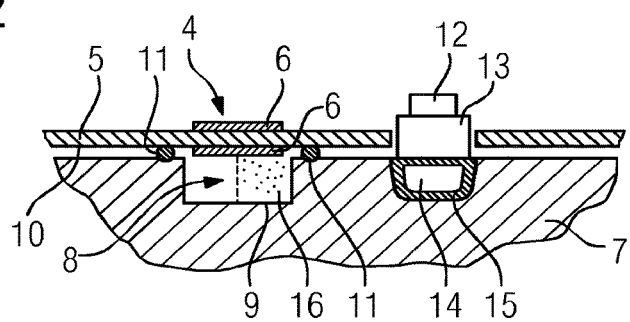
FIG. 2 shows a partial cross-section through the power amplifier device in a region of an electronics structure with coupled conductor paths.

FIG. 2 shows in greater detail a partial section through the interior of the power amplifier device 1 in the region of the balun 4. The partial section includes two conductor paths 6 inductively coupled to one another and arranged on opposing sides of a circuit board 5. The circuit board 5 is connected to a cooling plate 7 via an attachment device not illustrated in greater detail here. To provide a cavity 8 for the inductive coupling by the magnetic field, the cooling plate 7 has a depression 9 that follows the course of the conductor path 6, in the region of the conductor path 6 facing the cooling plate 7. A good electrically conductive connection to a conductive rear-side position 10 of the circuit board 5 is created by an electrically conductive elastomer 11 as a connection device that, for example, is provided by an electrically conductive elastomer gasket press-mounted between the plates 5, 7 connected by the attachment device. This may involve a silicon material (e.g., silicone) that is coated with silver.

In the region of a power amplifier module 2, it is shown by way of example for a transistor 12 that the circuit board 5 is pierced. The transistor 12 is a power electronics component that heats up during operation and is connected directly to the cooling plate 7, at a point at which a cooling channel 14 runs, via an excellently heat-conducting connection element 13 arranged in the opening. The cooling channel 14, which is used in the cooling plate 7, is made of copper 15. The cooling plate 7 is essentially made of aluminum. A cooling liquid (e.g., water) may be routed through the cooling channel 14. The waste heat of the transistor 12 is relayed through the connection element 13 and the copper 15 to the cooling liquid.

The balun 4 sometimes generates waste heat. For the better dissipation of the heat, the cavity 8 may not be filled with air, but may be filled with a readily heat-conducting material (e.g., an elastomer with a low dielectric constant), which is indicated as an optional embodiment in FIG. 2 only partially in the form of the material 16. This relates to a solid yet elastic elastomer that by being pressed together between the circuit board 5 and the cooling plate 7, enables a good thermal coupling to the conductor paths 6.

Figure 3:
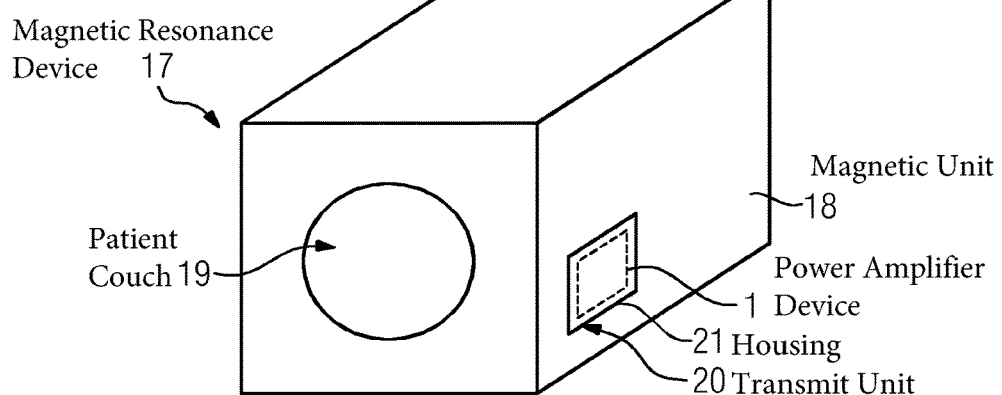
FIG. 3 shows one embodiment of a magnetic resonance device.

FIG. 3 shows a schematic diagram of one embodiment of a magnetic resonance device 17 that, in a known manner, includes a main magnetic unit 18 with a patient couch 19. The main magnetic unit includes coils for generating a main magnetic field. Shown arranged externally on the main magnetic unit 18 is a transmit unit 20 with a housing 21 that includes the power amplifier device 1.

Other components of the magnetic resonance device 17 are widely known in the prior art and are not explained in greater detail here.

Although the invention has been illustrated and described in detail based on the exemplary embodiments, the invention is not limited by the disclosed examples. Other variations may be derived herefrom by the person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A power amplifier device for providing power to a magnetic resonance device, the power amplifier device comprising:
    a circuit board;
    at least one power amplifier module comprising at least one power electronics component implemented on the circuit board;
    at least one electronics structure comprising coupled conductor paths arranged on opposing sides of the circuit board; and
    a cooling plate operable for cooling components on the circuit board that heat up during operation, the cooling plate abutting the circuit board on one side,
    wherein the cooling plate has a depression that follows a course of a conductor path of the coupled conductor paths and faces the conductor path in a region of the conductor path of the electronics structure that is arranged on a side of the circuit board facing the cooling plate.

2. The power amplifier device of claim 1, wherein the cooling plate is connected at least partially along an edge of the depression in an electrically conductive manner to a grounded electrically conductive, flat rear-side coating of the circuit board using a connector.

3. The power amplifier device of claim 2, wherein the connector is an elastic electrically conductive material that is press-mounted between the cooling plate and the circuit board.

4. The power amplifier device of claim 3, wherein the elastic electrically conductive material is an electrically conductive elastomer.

5. The power amplifier device of claim 1, wherein the cooling plate is attached to the circuit board by at least one attachment device.

6. The power amplifier device of claim 5, wherein the at least one attachment device is attached to the circuit board by at least one attachment device by screwing.

7. The power amplifier device of claim 1, wherein when the at least one electronics structure emits heat during operation, the depression is filled at least partially by a heat-conducting material.

8. The power amplifier device of claim 7, wherein when the at least one electronics structure emits heat during operation, the depression is filled completely by the heat-conducting material.

9. The power amplifier device of claim 1, wherein the electronics structure is a balun, a resonator, or the balun and the resonator coupled via a magnetic field.

10. The power amplifier device of claim 1, wherein the cooling plate is made of aluminum, copper, or aluminum and copper.

11. A transmit unit of a magnetic resonance device, the transmit unit comprising:
    a power amplifier device comprising:
        a circuit board;
        at least one power amplifier module comprising at least one power electronics component implemented on the circuit board;
        at least one electronics structure comprising coupled conductor paths arranged on opposing sides of the circuit board; and
        a cooling plate operable for cooling components on the circuit board that heat up during operation, the cooling plate abutting the circuit board on one side,
    wherein the cooling plate has a depression that follows a course of a conductor path of the coupled conductor paths and faces the conductor path in a region of the conductor path of the electronics structure that is arranged on a side of the circuit board facing the cooling plate.

12. The transmit unit of claim 11, wherein the cooling plate is connected at least partially along an edge of the depression in an electrically conductive manner to a grounded electrically conductive, flat rear-side coating of the circuit board using a connector.

13. The transmit unit of claim 12, wherein the connector is an elastic electrically conductive material that is press-mounted between the cooling plate and the circuit board.

14. The transmit unit of claim 13, wherein the elastic electrically conductive material is an electrically conductive elastomer.

15. The transmit unit of claim 11, wherein the cooling plate is attached to the circuit board by at least one attachment device.

16. The transmit unit of claim 15, wherein the at least one attachment device is attached to the circuit board by at least one attachment device by screwing.

17. The transmit unit of claim 1, wherein when the at least one electronics structure emits heat during operation, the depression is filled at least partially by a heat-conducting material.

18. The transmit unit of claim 17, wherein when the at least one electronics structure emits heat during operation, the depression is filled completely by the heat-conducting material.

19. The transmit unit of claim 11, wherein the electronics structure is a balun, a resonator, or the balun and the resonator coupled via a magnetic field.

20. The transmit unit of claim 11, wherein the cooling plate is made of aluminum, copper, or aluminum and copper.

* * * * *